United States Patent [19]

Weinreich et al.

[11] 4,396,879
[45] Aug. 2, 1983

[54] COUPLED SERIES AND PARALLEL RESONANT CIRCUIT, IN PARTICULAR FOR ELECTRIC FENCE APPARATUS

[75] Inventors: Wilhelm Weinreich, Korbach; Gerhard Schütz, Vohl, both of Fed. Rep. of Germany

[73] Assignee: Horizont-Geratewerk GmbH, Korbach, Fed. Rep. of Germany; by said Wilhelm Weinreich

[21] Appl. No.: 209,136

[22] Filed: Nov. 21, 1980

Related U.S. Application Data

[63] Continuation-in-part of Ser. No. 927,525, Oct. 20, 1978.

[30] Foreign Application Priority Data

Jul. 22, 1977 [DE] Fed. Rep. of Germany ...... 2733145
Mar. 14, 1980 [DE] Fed. Rep. of Germany ...... 3009838

[51] Int. Cl.³ .................................................. H02J 15/00
[52] U.S. Cl. .......................................... 320/1; 256/10; 340/564; 361/232
[58] Field of Search ............... 256/10; 340/564, 635; 361/232; 320/1

[56] References Cited

U.S. PATENT DOCUMENTS

| | | | |
|---|---|---|---|
| 2,316,211 | 4/1943 | Agnew et al. | 340/564 X |
| 3,182,211 | 5/1965 | Maratvech et al. | 256/10 X |
| 3,325,717 | 6/1967 | Nellis | 256/10 X |
| 3,655,994 | 4/1972 | Malme | 340/564 X |
| 3,772,529 | 11/1973 | Boeing | 256/10 X |
| 3,868,545 | 2/1975 | Caron | 361/232 X |
| 3,900,770 | 8/1975 | Kaufman | 361/232 X |
| 4,114,185 | 9/1978 | Gallagher | 340/564 X |

FOREIGN PATENT DOCUMENTS

| | | | |
|---|---|---|---|
| 1120021 | 12/1961 | Fed. Rep. of Germany | 256/10 |
| 1233892 | 6/1971 | United Kingdom | 361/232 |
| 2000919 | 1/1979 | United Kingdom | 361/232 |

*Primary Examiner*—William M. Shoop
*Attorney, Agent, or Firm*—H. Gibner Lehmann; K. Gibner Lehmann

[57] ABSTRACT

A charging circuit in an electric fence installation, comprising transformer or equivalent circuitry having series and parallel inductances and capacitances, wherein a solid state control switching device is provided in the energization line, which automatically opens the line at the time that the charging of the series capacitance represented by the fence-to-ground capacity is at or nearly at the upper peak value of the transient voltage which occurs.

16 Claims, 15 Drawing Figures

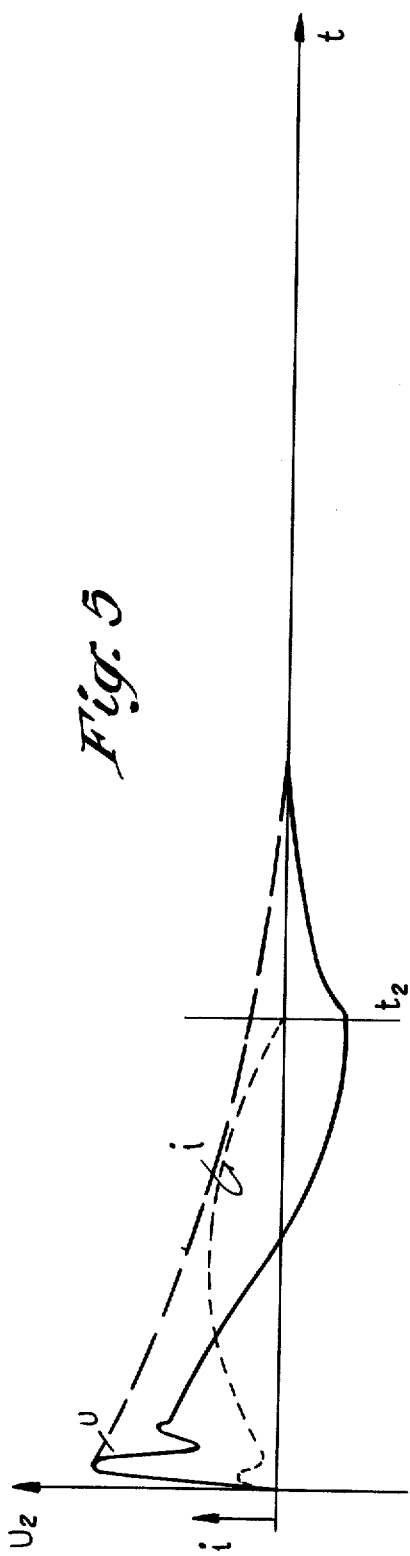
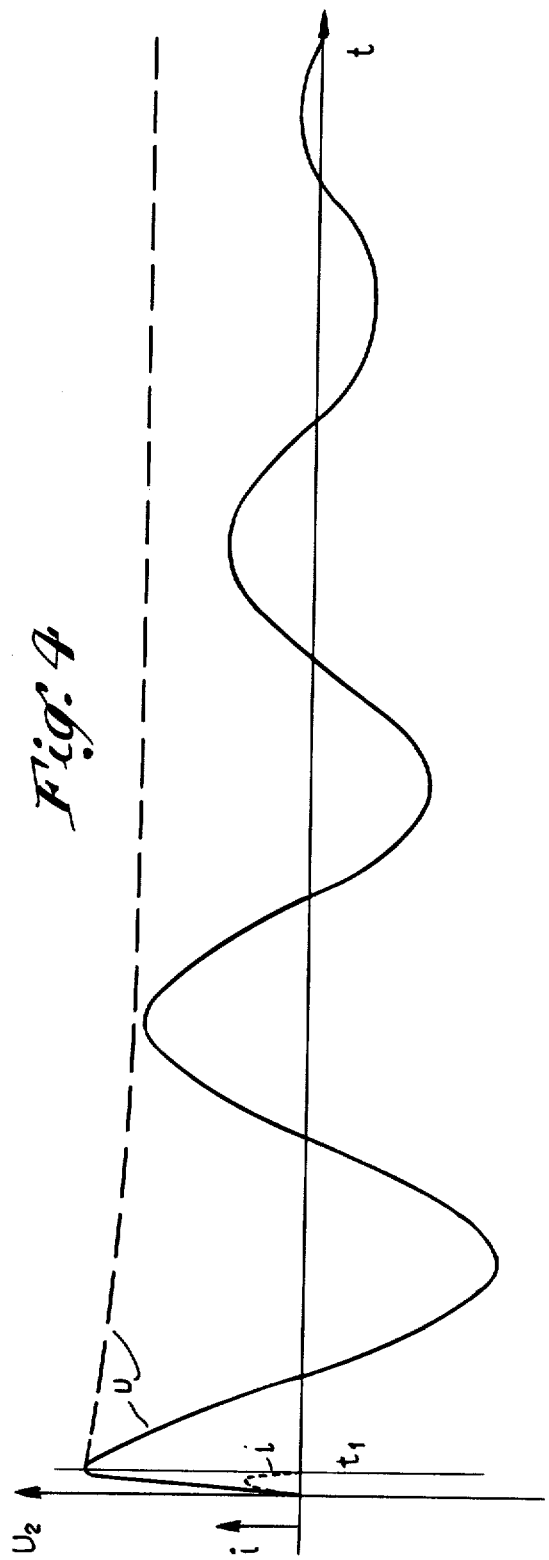

COUPLED SERIES AND PARALLEL RESONANT CIRCUIT, IN PARTICULAR FOR ELECTRIC FENCE APPARATUS

This application is a continuation-in-part of our co-pending application Ser. No. 927,525 filed Oct. 20, 1978 and entitled "Coupled Series And Parallel Resonant Circuit, In Particular For Electric Fence Apparatus."

Applicants hereby claim priority, under 35 U.S.C. 119, of corresponding German Application No. P 27 33 145.9 filed in Germany on July 22, 1977, and also claim priority, under 35 U.S.C. 119, of corresponding German Application No. P 30 09 838.5 filed in Germany on Mar. 14, 1980.

BACKGROUND

The invention relates to energization systems for electric fences, and more particularly to a coupled series and parallel resonant circuit for an electric fence apparatus, which contains, in addition to its parallel inductance, its smaller series inductance, the parallel and series (fence) capacitances respectively, and the ohmic circuit resistances, an automatic switching element or device through which the parallel capacitance is charged from a voltage source to an operating voltage ($U_1$) and is wired to the parallel inductance. Transients, occurring via the series inductance first upon the activation of the switching element, charge the series capacitance or fence to a transient voltage ($U_2$) which is appreciably higher than the supply or operating voltage ($U_1$).

Coupled series and parallel resonant circuits of the kind described above are known in electric fence apparatuses; the parallel capacitance comprises a charging capacitor which is connected in parallel with the primary side of a pulse transformer. The series capacitor is the fence capacitance that is connected in parallel with the secondary side of the pulse transformer; the ohmic circuit resistances are the unavoidable ohmic resistances of the windings and the insulation resistance of the fence wire. The parallel inductance is constituted of the principal inductance of the pulse transformer, and the series inductance is constituted of the leakage inductance of the pulse transformer. Normally, the leakage inductance of the pulse transformer is considerably smaller than the principal inductance (such as about 10%), and the capacitance of the fence to ground is likewise considerably smaller than that of the charging capacitor.

It is also known in such circuits to use a thyristor or transistor as the switching device or element. When the switching element in the known arrangements is closed, a transient current will first flow via the series inductance and the series capacitance, with the transient voltage at the series capacitance increasing up to twice the voltage at the parallel capacitance, depending on the selection of the switching elements. Due to the series connection of the parallel capacitance and the series capacitance, the total or overall series capacitance is small, as is also the series inductance. Therefore, the frequency of the transients is relatively great, and the pulse width is very narrow.

In addition, the transients are subject to severe attenuation. Therefore, what practically occurs is a one-time overswing, going over into a cosine function as the principal oscillation. This principal oscillation is essentially determined by the parallel capacitance and the parallel inductance, with the operating voltage ($U_1$) representing the peak voltage of the cosine function.

The effect of an electric fence apparatus on an animal depend a greatly on the pulse data. The pulse voltage should be as high as possible and also the pulse width, so that the voltage-time area is great; the effect is particularly intense if the pulses are already wide at their peaks. But in the prior arrangement described above, the shock effect at the fence is essentially determined by the cosine function and the narrow overswing contributes virtually nothing to the shock effect.

Another deficiency of the above-described arrangement in electric fence apparatuses is its high loss of electric energy. The switching element commonly used in the above described known arrangement is a thyristor which allows the positive current half-wave to pass while blocking currents attempting to flow in a reverse direction. During the positive current half-wave, the charging capacitor or the parallel capacitance is charged to a small reverse polarity which is only a fraction of the operating voltage ($U_1$), because of the attenuation. For this negative or reverse voltage, the charging circuit of prior devices (not described here in detail) is connected in the forward or flow direction. This charging capacitor is thus seen to discharge down to zero and then to be recharged to its operating voltage ($U_1$), whereupon the cycle continually repeats.

Depending on the size of the fence capacitance, the maximum energy stored in the fence capacitor (with the maximum fence voltage) is only a fraction of the energy in the charging capacitor, so that the differences or differential energy is lost. In electric fence apparatuses of usual design and with usual fence lengths, two to three times the amount of energy applied to the fence must be fed to the charging capacitor. These energy losses are particularly disadvantageous in apparatuses fed by dry cells, the energy of which is very expensive.

SUMMARY

In view of this situation it is an object of the present invention to provide an improved circuit arrangement which avoids the above unnecessary energy losses and which, at the same time, alters the pulse shape so as to achieve a greater shock effect.

According to the invention, this problem is solved in that, in a circuit arrangement designed in principle as described above, the solid state switching device or element is automatically opened to disconnect the charging capacitor at the moment, or at least near the moment of maximum peak voltage that is exhibited at the series capacitance, i.e. at the fence.

By opening the switching element at this moment, only that energy is utilized, which is supplied to the fence (the series capacitance) up to such moment from the parallel or charging capacitor. Any other energy drainage is stopped, and the parallel capacitance or charging capacitor discharges only in part. But in spite of this, compared to the known circuit arrangements, the amount of energy transferred up to this moment into the fence (the series capacitance) remains unchanged, and the same maximum transient voltage is reached. Due to the automatic opening of the switching element, which takes place at this moment according to the invention, the series resonant circuit is now interrupted, and the energy stored in the fence (or series capacitance) can no longer swing back via this path. The only path remaining for it is via the considerably greater parallel inductance. This causes the pulse width in this resonant circuit to become much greater than before. The voltage at the fence (or series capacitance) dies out in wide half-waves from the very high initial value.

According to the invention, the solid state switching device can be a fast thyristor, or it can be a controlled transistor, and the switching-off of the device occurs when a combination of two typical electrical values is had. If the switching device is a thyristor, the two values are the typical holding current of the thyristor and the typical turn-off time thereof. If the switching device is a controlled transistor, the two values are the scanned maximum positive voltage at the secondary side of the impulse transformer and the time differentiation of the voltage oscillation function at the transformer secondary.

Another positive effect or advantage of cutting off the parallel capacitance at such moment of maximum voltage at the series capacitance, according to the invention, is the avoidance of attenuation because of the ohmic resistance that was cut out of the circuit, with the result that now quite a number of half-waves of initially still very high peak voltage become effective at the fence, in contrast to the known arrangements of this kind in which practically only one full quarter-wave (even though of greater pulse width, but of lower voltage) is applied to the parallel capacitance. Accordingly, two essential advantages are obtained through the present invention as follows:

(a) Considerable energy savings are had, and (b) there is attained a distinctly greater shock intensity and functional reliability (in particular under dry conditions) due to the complete formation of a slightly attenuated oscillation of high initial voltage and relatively great pulse width.

The solid state switching element can advantageously be a known type of fast thyristor which, according to the invention, can be operated either in automatic phase or by remote control, or it can be a controlled transistor which is triggered by electronic means.

The transient data (amplitude, half-wave duration etc.) depend on the electrical data of the elements of the series resonant circuit, of which the insulation resistance or leakage resistance is not the least. Every electric fence has leakage resistances which depend on the quality of the fence insulation and on a possible animal contact. These resistances may range from between 500 ohms to an infinite ohmage, e.g. 50 K-ohm when the fence insulation is good and about 5 K-ohm in case of an animal contact. The first half-wave of the transient current, which is particularly important in this connection, is not constant but directly dependent on the respective fence data (resistance and capacitance). At an appropriate load the current-time area covered by the half-wave can already be so great that the parallel capacitance or charging capacitor is discharged completely. In the usual design, this is the case when the fence resistance is small (in case of animal contact). In such event the entire energy stored in the charging capacitor (parallel capacitance) is transferred to the ohmic resistance load (animal) so that the maximum electric shock possible is now generated. Without any ohmic resistance load (a normal open-circuit fence) only a fraction of the maximum energy possible is consumed in the fence load.

This represents the savings effect according to the invention, where heretofore the differential energy between the small demand of an open-circuit and the maximum energy stored in the charging capacitor (parallel capacitance) was lost in additional losses in the apparatus.

Starting from the interdependence, according to the invention, between the residual load in the charging capacitor and the fence load, two other very advantageous effects are had, as follows.

1. Fence interruption signalling:

It is important for the farmer to be able to check at one point of the electric fence, whether there is an interruption in the fence wire whereby actually only a part of the fence is carrying voltage. The so-called stranded fence wire is being used increasingly today. This is a wire of several plastic strands with copper or steel wires braided in as conductors. When such a stranded wire is overstressed it often happens that the electrical conductors break, but the plastic supportng strands do not. Therefore, the fence wire does not fall to the ground, and the ground short monitor cannot detect the fault, nor can a visual inspection of the fence wire reveal it. This hidden fault (as can readily be imagined) has very disagreeable consequences for the farmer. At present, no signalling means has yet been devised for the electrical break of a fence wire.

According to the invention, utilizing the interrelationship above mentioned, the residual load at the charging capacitor (parallel capacitance) can be a measure of the fence condition. What this requires is that the residual load data be supplied to a known control unit after the installation of the respective fence. When a break occurs in the fence, a part of the fence capacitance is shut off, causing the residual load to decrease. The actual deviation from the rated value can then be utilized to activate a signal device.

2. Signalling of a fence short circuit, or fence contact:

With a strong ohmic fence load (such as in the event of animal contact or ground contact) the residual load at the charging capacitor (parallel capacitance) becomes considerably smaller than the set rated value. In such a case the deviation of the actual from the rated value can again be utilized for signalling purposes, also for the purpose of providing an additional or stronger pulse.

Two embodiment examples of the present invention are described below in greater detail, with reference to the drawings in which:

FIG. 4 is the voltage curve at the fence (or series capacitance) and corresponding current curve for the circuits of FIGS. 1 and 2, for a heavy or greater-than-normal damping operating condition.

FIG. 5 is the voltage curve at the fence (or series capacitance) and corresponding current curve for the circuits of FIGS. 1 and 2, for a normal or low damping operating condition. The second half-wave of the current can cause switch-off of the thyristor.

FIG. 6 illustrates the current for a light damping condition.

FIG. 7 illustrates the current for a somewhat heavier damping condition, with switch-off still occurring under the influence of the transient current oscillation.

FIG. 8 illustrates the current for a still heavier damping condition, wherein i becomes less than $I_H$ for a time period which is less than $t_g$.

FIG. 9 illustrates the current for yet a still heavier damping condition, wherein i in the transient region does not become less than $I_H$.

Figure 1:
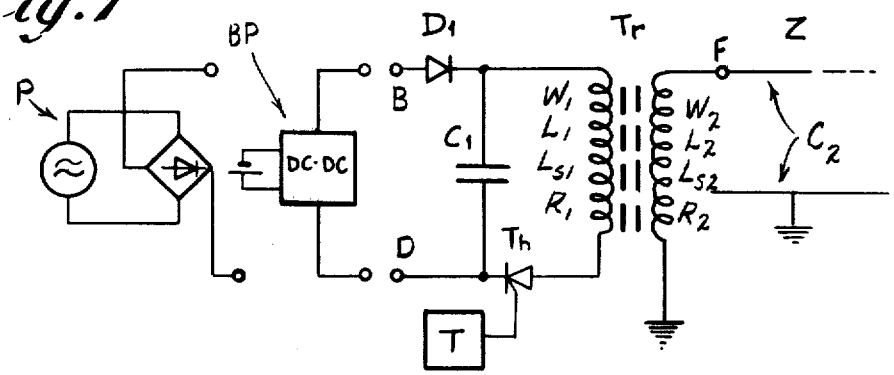
FIG. 1 is a schematic circuit diagram illustrating one embodiment of the invention, showing an electrical fence circuit having an impulse transformer, series and parallel resonant branches, a switching thyristor, and a power supply.
Figure 2:
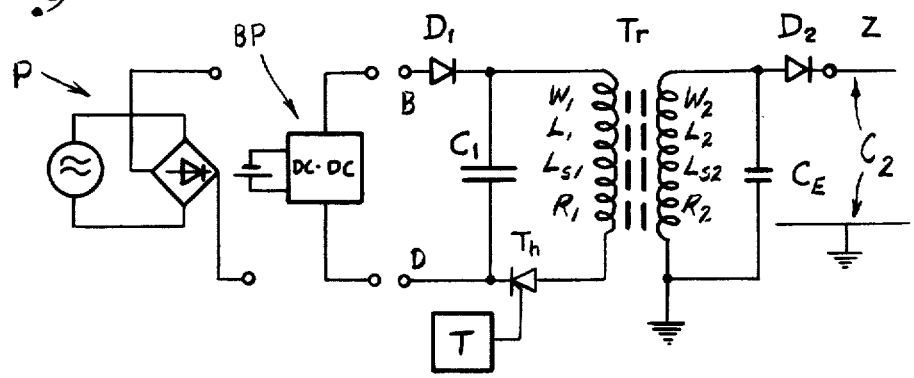
FIG. 2 is a circuit diagram similar to that of FIG. 1 but with the addition of a diode in the secondary circuit of the impulse transformer.
Figure 3:
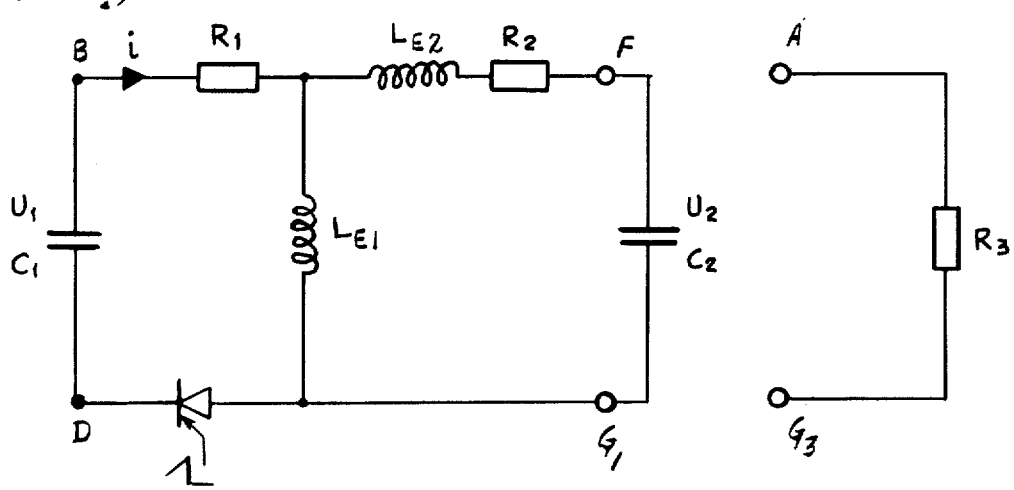
FIG. 3 is an equivalent circuit diagram with reference to FIGS. 1 and 2.

As seen in FIGS. 1, 2 and 3 the coupled series and parallel resonant circuit according to the invention contains a parallel inductance $L_{E1}$, a smaller series inductance $L_{E2}$ about 1/10 the value of the parallel inductance $L_{E1}$, parallel and series capacitors $C_1$ and $C_2$ respectively, ohmic circuit resistances $R_1$ and $R_2$ as well as a solid state switching element or device $T_h$. The switching element $T_h$ is disposed so as to be located in both the series resonant circuit and the parallel resonant circuit, namely between the parallel capacitor $C_1$ and the parallel inductance $L_1$ on the one hand and between the parallel capacitor $C_1$ and the series capacitor $C_2$ on the other hand. The parallel capacitor $C_1$ is continuously charged to operating voltage $U_1$ by either a rectified alternating current supply P or a battery pack BP as shown, either of which can be connected across the capacitor terminals B and D.

The series-parallel resonant circuit shown in FIG. 3 can be considered as the equivalent circuit diagram of the pulse transformer $T_r$, with an electric fence conductor Z connected to the secondary side as at the point F and the charging capacitor $C_1$ temporarily connectable to the primary side by means of the switching element $T_h$. The ground could be connected to the point $G_1$ of the circuit. The load $R_3$, connectable from A to F and $G_3$ to $G_1$ according to FIG. 3 represents the case of animal contact or a temporary leak resistance, such as ground contact of the fence or the like.

Besides being formed by the capacitance of the fence to ground, the series capacitance $C_2$ can preferably be formed in addition by a high-quality high-voltage capacitor paralleled thereto in order to influence advantageously the pulse width in the manner explained in connection with FIG. 2.

When the thyristor is used as the switching element, it can operate so as to go into conduction when the voltage $U_1$ is reached at the charging capacitor $C_1$. The thyristor's operating mode to inhibit the passage of current is explained in the following, with reference to FIGS. 1-3.

Due to the smaller series inductance, there first appear upon closing the switching element $T_h$, transients via the series resonant circuit $C_1$, $L_2$, $C_2$, in the course of which the voltage at the fence capacitor $C_2$ (series capacitance) reaches approximately twice the value of $Ü \times U_1$ at the time $T_1$ ($Ü$ = transmission ratio of the pulse transformer $T_r$). The frequency is determined by the series inductance $L_2$ and the series capacitance $C_2$, both being small as compared to the others. The oscillation frequency is high. The pulses are narrow and greatly attenuated because of the frequency-dependent iron losses. In prior devices the transients are followed by the principal oscillation (a cosine function) primarily determined by the parallel inductance $L_1$ and the parallel capacitance $C_1$ ($U_2$ roughly equals $Ü \times U_1$). A positive and negative current flows through the series circuit during the transient phase, and subsequently a sine-shaped current for one half-wave during the principal oscillation. In the conventional circuit arrangements using a thyristor as the switching element, the latter blocks conduction when the sine-shaped current of the principal oscillation passes through zero, this being accomplished through certain circuit features and design objectives to provide that the small negative half-wave belonging to the transients does not lead to a shutoff of the thyristor. In the conventional circuit arrangements, therefore, the charging capacitor $C_1$ of the parallel capacitance is charged with a reversed polarity. This charge discharges via the not-shown circuit features of the charger. Therefore, the charging capacitor $C_1$ must be recharged completely. At the fence or series capacitor, and hence at an animal touching the fence wire, practically a quarter-wave becomes effective, the peak voltage of which is $Ü/U_1$ and the width of which is determined by $C_1$, $U^2 \times C_2$ and $L_1$ because at the end of the transients, $L_2$ becomes practically ineffective and $C_2$ is thus paralleled to $C_1$. Because of its narrowness, the prior transient pulse is practically ineffective.

The circuit arrangement according to the invention, with its fence voltage curve $U_2$ and series circuit current i being shown in FIGS. 4 and 5 is characterized in that the thyristor currrent when approaching zero during the transient phase switches off the thyristor $T_h$ quite quickly. At the time $t_1$ of this zero current, the fence voltage $U_2$ is at its peak (approximately $2 \times Ü \times U_1$). With this switching process the parallel capacitance or charging capacitor $C_1$ is cut off and uncoupled at the time $t_1$. The energy that was transferred to the fence capacitor $C_2$ by the parallel capacitance or charging capacitor $C_1$ must now in the main shuttle back and forth between the parallel inductance $L_1$ and the series capacitance $C_2$. The circuit resistance $R_2$ in the series circuit has the only attenuating effect. The voltage pulse width of the present device is determined by the parallel inductance $L_1$ and the series capacitance $C_2$. This voltage pulse width is narrower in prior devices where it is determined by the greater parallel capacitance and parallel inductance. By appropriately selecting the series capacitance $C_2$, such as by paralleling a high-quality high-voltage capacitor to the electric fence, about half the pulse width can be obtained. By the same token, the oscillation amplitude can be varied. The resonant circuit $C_1$, $L_1$ contains the open switch $T_h$ so that quite a number of half-waves of initially still high voltage can form, each one exerting a corresponding shock effect when an animal touches the fence, provided the fence insulation is such that this pulse is not altered substantially.

It is quite decisive, however, that the charging capacitor $C_1$ only need supply the relatively small amount of current $Q_1$, i.e. only that amount of energy which is actually transferred into the series capacitance $C_2$. The great current loss $Q$ is thus completely avoided.

The circuit operation for FIGS. 1–3 is as follows: Repeated firing of the thyristor occurs by means of repeated impulses given from the timer T onto the thyristor $T_h$ at a repetition rate of not faster than once each second. By each such an impulse the thyristor becomes conductive, and a discharge current from $C_1$ is initiated. Such discharge current is in the form of two superimposed electrical current oscillations in the parallel resonant circuit and the series resonant circuit.

Figure 6:
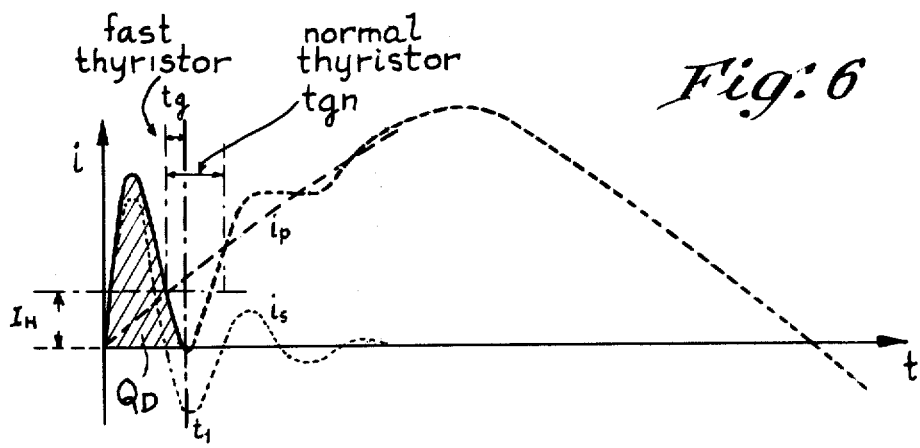
FIGS. 6 through 9 are enlarged current graphs of the currents depicted in FIGS. 4 and 5, wherein specifically.

With respect to the fact that the equivalent capacity of the capacitor $C_1$ and the equivalent inductivity of the transformer windings are much greater than the equivalent capacity $C_2$ of the electrical fence and the equivalent inductivity $L_{E2}$ of the stray field of the impulse transformer respectively, the electrical oscillation frequency of the series resonant circuit $L_2$, $C_2$ is much higher than that of the parallel resonant circuit $C_1$, $L_{E1}$. Therefore initially the oscillation behavior of the coupled circuits is substantially determined by the oscillation in the series resonant circuit (this is true under the assumption that the damping condition in the series resonant circuit is relatively low.). Under these conditions the discharge current will oscillate somewhat in the manner indicated in FIG. 5 by the broken fine line. In FIG. 6 a resultant positive (2nd) half-wave current value less than $I_H$ is shown. $I_H$ is the so-called holding current of the thyristor. This holding current is different from type to type, and is different for each one thyristor. If the electrical current through the thyristor should lower the specified holding current, then the thyristor will tend to switch off, but it will not switch off or turn off immediately. There is a further special typical time, the so-called turn-off-time $t_g$, and the thyristor turns off or switches off after this turn-off-time terminates. Such typical turn-off-time is quite different for the different types of thyristors. In fast switching thyristors, such turn-off-time may be between 5 μs and 50 μs. Data of typical fast switching thyristors are available in the market. The graphs of FIGS. 8 and 9 show that no early switching off occurs at the thyristor, for the heavy damping.

Figure 7:
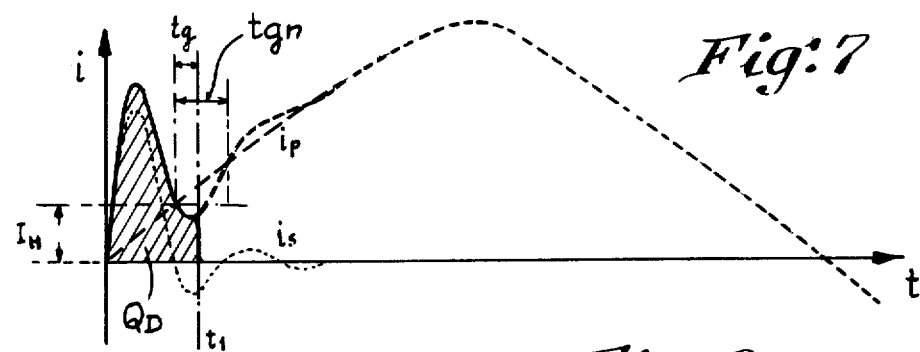
Figure 8:
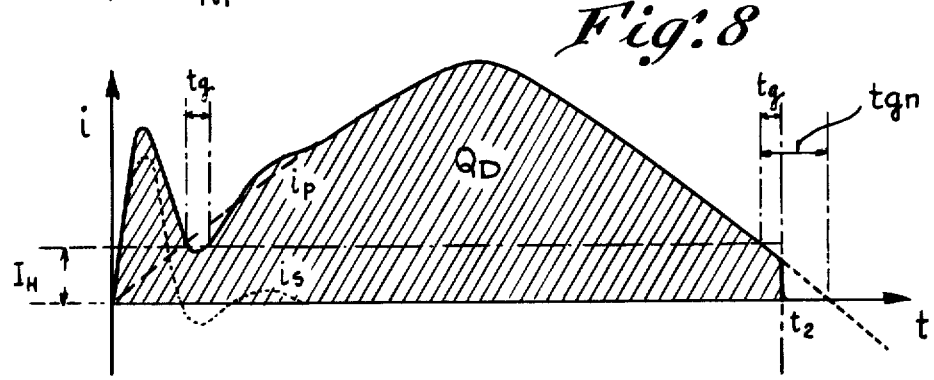
Figure 9:
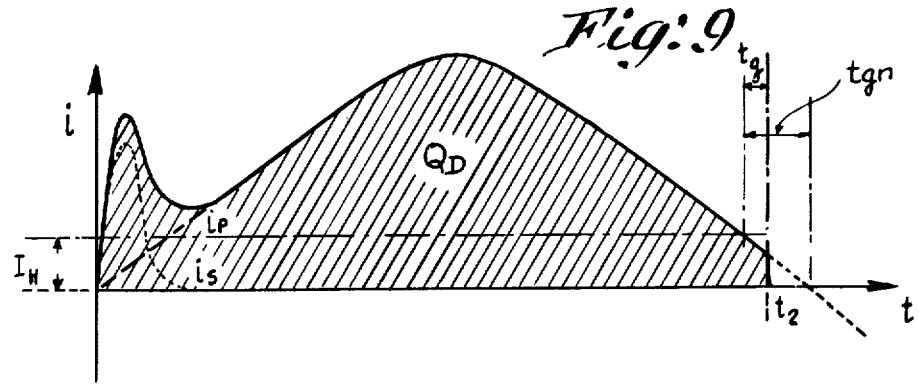

The second half-wave of the transient current $i_s$ in FIG. 6 bucks the holding current $I_H$ of the thyristor $T_h$ and will deprive the latter of its holding current during this second half-wave whereby it switches off after its turn-off-time or interval, which is designated $t_g$ in FIGS. 6–9. The time at cut-off or switch-off is designated $t_1$ in FIGS. 6 and 7. The lines on the curves illustrate the cut-off condition and cut-off point. In FIG. 7, with greater damping, the time $t_1$ for effecting cut-off is longer. In FIG. 8 no quick cut-off or switching open of the thyristor occurs, the cut-off point being at $t_2$. In FIG. 2 where there is also no quick cut-off, the thyristor is likewise switched off at the time $t_2$.

It is an important aspect of the present invention, to use such a fast-switching thyristor in an impulse generator for electric fence apparatuses and the like. Such fast-switching thyristors presently are used only in computer and controlling circuits.

A second important feature of the present invention is that the holding current and the typical turn-off-time of the thyristor are related or adapted to the initial oscillation behavior of the coupled series and parallel resonant circuits, such that the thyristor turns off within the second half period of the discharging current oscillation, because the positive holding current needed by the thyristor will not be evident during this second half period under normal conditions.

A third important feature of the present invention is that the impulse timer T is so chosen that the time during which the firing pulse is active at the thyristor is long enough to fully install the discharging current and to overcome the normal delay time of the thyristor, but still short enough that the firing pulse is clearly over when the discharge current oscillation reaches the holding current value at the end of the first half period of the current oscillation. The first part of this feature is necessary in order to get a positive firing and initiation of the discharge current oscillation. The second part of the feature is necessary in order to avoid adversely affecting the above-described quick switching-off condition of the thyristor. Further, the time period between subsequent firing impulses must be long enough that the above switching-off condition cannot be affected by any subsequent firing impulses. This last part of the feature is normally self-evident by the fact that it is officially prescribed that the time period between subsequent fence impulses must be at least 1 to 2 seconds. This time period is, of course, very much longer than the oscillation periods in question. Therefore, normally in electrical fence apparatuses, impulse timers have to be used in which the time periods between subsequent firing impulses are adapted to the official prescriptions.

It should be noted that in the operation of the present invention it is not the "reverse current," by which the thyristor is switched off, but instead a special switching-off operation in connection with the coupled series and parallel resonant circuits, where the discharge current is an oscillation current and normally reaches a value which bucks or is lower than and overcomes the holding current of the thyristor. And the thyristor only switches off if this positive holding current is not maintained throughout the typical turn-off-time of the thyristor.

There must not be a negative current or reverse current in the thyristor for effecting the switching off, and this is a further important aspect of the present invention.

As shown in FIG. 6, a damping current oscillation $i_s$ has occured under increased damping conditions at the electrical fence or other load of the apparatus. Such damping in the discharge current oscillation results in the negative half of the oscillation wave being decreased (that is, the current is positively elevated). The discharge current $i_p$ will remain on the positive side, but nevertheless the thyristor can be chosen such that it switches off without any negative (reverse) half-wave of the discharge current oscillation. There are commercially available fast-switching thyristors having relatively high positive holding current values $I_H$ up to 150 mA. Thus, by choice of the thyristor it will be possible to get the abovedescribed switching-off operation under high damping conditions and under conditions where no reverse current will occur.

It is intended by the present invention that under high damping conditions an increased impulse should be generated on the electrical fence. This will be obtained, because under high damping conditions the second half-wave of the discharge current oscillation $i_p$ as determined by the series resonant circuit frequency, will not appear at a value which is lower than the holding current of the chosen thyristor (FIG. 8), or it may not appear at a value lower than the holding current of the chosen thyristor for a time period which is longer than the typical turn-off-time of the chosen thyristor (FIG. 9).

Under such high damping, the switching-off conditions of the chosen thyristor are only available later, at the end of the first positive half-wave of the discharge current oscillation $i_p$ as it is determined by the parallel resonant circuit frequency (determined by the capacity of the parallel capacitor $C_1$ and the winding inductance $L_{EI}$ of the transformer). This means that under this condition the parallel capacitor will become practically fully discharged. This possibility is illustrated in FIGS. 8 and 9.

Special fast-switching thyristors to be used in connection with the invention are available on the market, as for example from Siemens (German) type CS 15.9–10g.2. The timer can be an electronic element available on the market from Siemens, type TDBZ608 DP.

The basic operation may be briefly summarized as follows, with respect to FIGS. 1, 3 and 6. The timer T sends pulses, one every second or so, to the thyristor $T_h$. Such pulses switch on the thyristor $T_h$, and the capacitor $C_1$ will excite the transformer $T_r$. With a given set of components, the circuit, including the fence Z will have a predetermined resonant frequency. For a light load condition (low damping) the resonant current will appear as $i_s$ in FIG. 6 when the timer T sends one of its exciting pulses to the thyristor $T_h$. To the holding current $I_H$ of the thyristor, the wave $i_s$ is added, then subtracted, to produce the resultant current wave $i_p$ which, in its second half cycle, switches off the thyristor $T_h$ at the time $t_1$ after the thyristor turn-off-time $t_g$ has expired. The flux in the transformer core collapses. The fence Z then experiences, from the secondary winding $W_2$ of the transformer $T_r$, an effective high voltage pulse to move the animal from it. The rapid collapse of flux in the core of the transformer $T_r$ results in the fence voltage pulse being of very high tension. To effect the quick open-switching of the thyristor $T_h$ it is not necessary for the resultant current $i_p$ to pass to the negative value, as can be readily seen from FIGS. 6 and 7. This distinguishes the present invention from prior devices.

Note that the operation of the embodiment of FIGS. 10–12 also utilizes the wave form of the transient current in the secondary circuit to effect early switching-off of the capacitor $C_1$ but the operation utilizes a scanning procedure, as will be explained below.

In the second embodiment of the invention shown in FIGS. 10–14 the electronic switching means comprises a switching transistor $T_f$ having a base or control element, and comprises a controlling means EC for the transistor. The transistor controlling means EC contains an electrical scanning circuit SC, which is able to scan the voltage at the secondary side of the impulse transformer $T_r$. In the case of using a diode between the secondary side of the impulse transformer and the electrical fence (FIG. 11), the voltage is scanned at the capacitor $C_2$.

Figure 13:
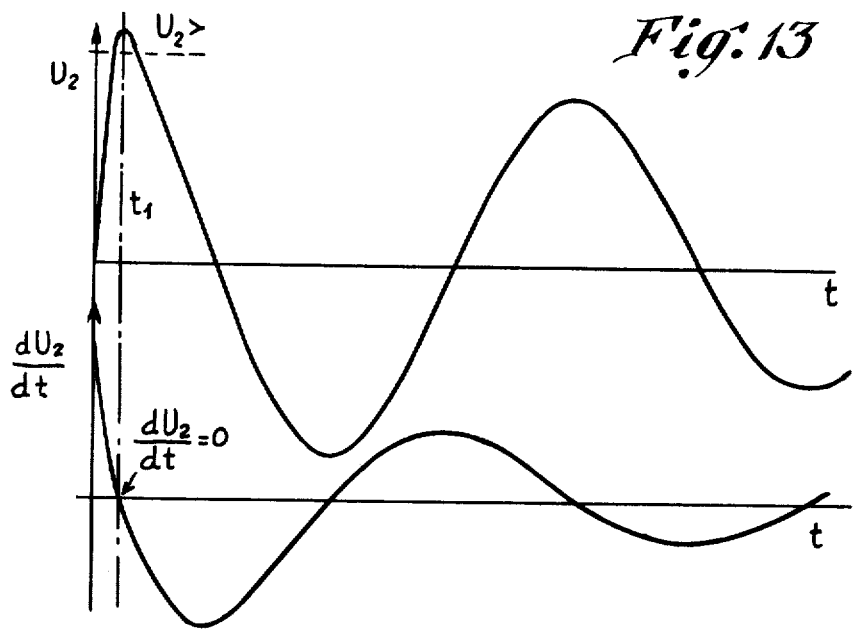
FIG. 13 is a voltage graph or curve of $U_2$ and $dU_2/dt$ for a normal or low damping operation.
Figure 14:
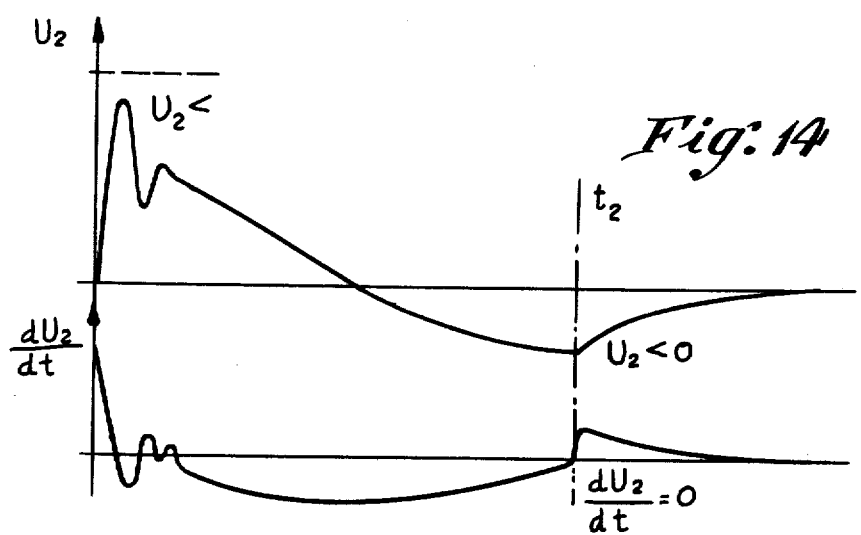
FIG. 14 is a voltage graph or curve of $U_2$ and $dU_2/dt$ for a heavy damping operation.

Further, the transistor controlling means contains a differentiating circuit (sometimes known as a fast time-constant circuit F.T.C.) in order to form a time differentiation of the voltage at the secondary side of the impulse transformer. Such time differentiation is shown in FIGS. 13 and 14. The transistor controlling means contains a computing and impulse generating circuit CI, which is intended to generate a negative impulse to switch off the transistor under the condition when the positive voltage at the secondary of the impulse transformer is beyond a chosen threshold value, or if the voltage at the secondary of the impulse transformer is a negative one. The impulse is generated in the moment when $dU_2/dT$ is zero.

Regarding FIGS. 13 and 14, under normal conditions the first voltage impulse generated at the secondary of the impulse transformer is seen to be beyond the chosen threshold value UT, and in such case switching-off of the transistor occurs when $dU_2/dt=0$.

Under heavy damping conditions $U_2$ will not reach the threshold value $U_T$ and then the second possibility occurs. This means that the switching-off impulse will generate when $dU_2/dT=0$ (for the second occurance) and $U_2$ is negative.

By these arrangements switching-off occurs under normal conditions in accordance with FIG. 4 when $U_2$ reaches its maximum value. Under heavy damping conditions, switching-off occurs in accordance with FIG. 5 when $U_2$ reaches its minimum (maximum negative) value.

Finally, the controlling means for the transistor contains a timer circuit which is practically the same one as provided in the circuit of FIGS. 1 and 2.

Figure 12:
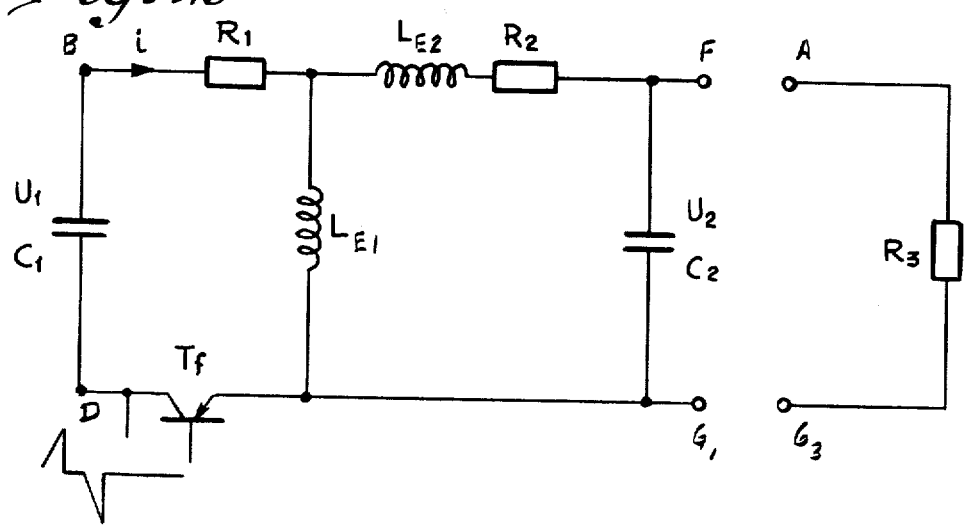
FIG. 12 is an equivalent circuit diagram with reference to FIGS. 10 and 11.

With respect to FIGS. 3 and 12, it is well known in the art that electrical values (as resistance, inductance and capacitance) of the elements used in an electrical circuit can be transformed to equivalent values by use of an equivalent circuit diagram. There are special known formulae by which such calculations are done. Therefore the FIG. 3 diagram is a real equivalent to the circuits of FIGS. 1 and 2. The frequency of the series resonant circuit is defined by the equivalent values of L and C. By this calculation the type of thyristor can be clearly determined. Through the explained automatic switching effect, the above-mentioned signalling of a fence short circuit or of a fence contact can be realized with functional reliability. In FIG. 3 the contact of an animal with the fence can be shown by connecting the terminals A, $G_3$ of the load $R_3$ respectively to the terminals F, $G_1$ of the resonant circuit.

Figure 15:
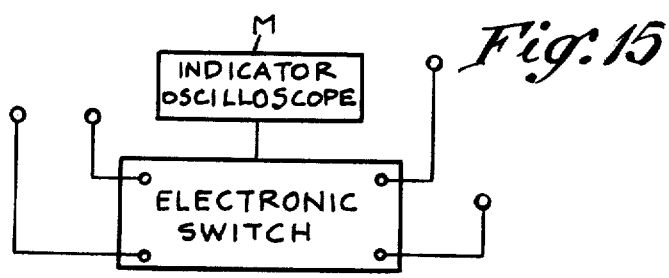
FIG. 15 shows an electronic switch and indicator oscilloscope for effecting an electronic control of the switching in conjunction with an oscilloscope.

Those skilled in the art, when apprised of the invention, can readily select known and available equipment to effect the automatic opening of the solid state switch $T_h$, or $T_f$. FIG. 15 depicts an electronic switch ES and oscilloscope indicator M apparatus having terminals $D_2$, $E_2$, $F_2$ and $G_2$ adapted to be connected to the terminals D, E, F and $G_1$ of FIG. 3 respectively, to open the switch $T_h$ or $T_f$ when the voltage $U_2$ across $C_2$ is at or nearly at its peak value. The known oscilloscope indicator M will show the deviation in the rated residual load of the capacitor $C_1$, indicating a break in the fence wire, or fence short circuit, or fence contact. Other known arrangements to effect opening of the switch and the signalling functions are also possible. Sheets having commercial thyristor-timer data are attached.

Referring again to FIGS. 6–9 inclusive, the heavy broken lines of the curve $i_p$, showing theoretical continuations of the discharge current, represent the theoretical values if there is no switching-off of the thyristor $T_h$. But when switch-off occurs, as at $t_1$ or $t_2$, the discharge current then drops to zero, as shown by the heavy vertical lines of the curves.

The relatively long switch-off intervals of normal (slower acting) thyristors, as compared to the more recent fast-acting thyristors, is indicated by $t_{gn}$. Note that once the thyristor has been switched off, its holding current ceases until the timer T again switches it on.

The cross-hatched or shaded portions of the curves are indicated $Q_D$, and are representative of the energy delivered by the charging capacitor $C_1$ to the transformer $T_r$ upon the occasion of animal contact with the fence.

In FIGS. 6 and 7, $Q_D$ is much smaller than in FIGS. 8 and 9, and it is smaller in FIG. 6 as compared with FIG. 7, likewise in FIG. 8 as compared with FIG. 9. These are secondary effects, since the real effect is represented by the difference between $t_1$ and $t_2$.

FIGS. 6-9 are schematic and are expanded along the time axis. In practice, $t_1$ is very near the i-axis whereby only a very short current impulse occurs before the circuit opens and the flux collapses in the transformer $T_r$. This current impulse is almost not measurable with instruments of normal sensitivity. The oscillating transient impulses are more or less undesired, being unavoidable secondary effects in the normal operation of impulse generators comprising an impulse transformer and electrical condensers. We have found, however, that such undesired secondary effects can be utilized to produce an advantageous switching-off of the discharge current at the moment $t_1$ when only a smaller charge has been delivered by the capacitor $C_1$. The invention utilizes fast-switching thyristors in order to take advantage of these secondary effects, in an oscillating circuit containing an impulse transformer and electrical capacitors at the primary and secondary sides thereof.

In accordance with the invention, the pulse transformer $T_r$ is designed with a substantially smaller leakage inductance $L_{S1}$, $L_{S2}$ than the winding inductances $L_1$, $L_2$. The parallel resonant circuit formed by the equivalent capacity of the input capacitor $C_1$ and the equivalent winding inductance $L_{E1}$ has a considerably lower electric oscillation frequency than the coupled series resonant circuit formed by the equivalent capacity of the essentially capacitive electric load resistance $C_2$, $C_E$ and the equivalent leakage inductance $L_{E2}$. The thyristor $T_h$ is selected so as to have a noticeable holding current $I_H$ which, however, is considerably smaller than the initial discharge current of the input capacitor $C_1$ building up in a sine-shaped positive half-wave of the frequency of the series resonant circuit, and to have a recovery time $t_g$ that is shorter than the oscillation frequency half-period of the series resonant circuit. Also, the pulse timer T is selected so that the pulse length in time of the firing pulses given by it to the thyristor $T_h$ is shorter than the oscillation frequency half-period of the series resonant circuit, and the time interval in the sequence of firing pulses is substantially longer than the oscillation frequency period of the series resonant circuit.

Figure 10:
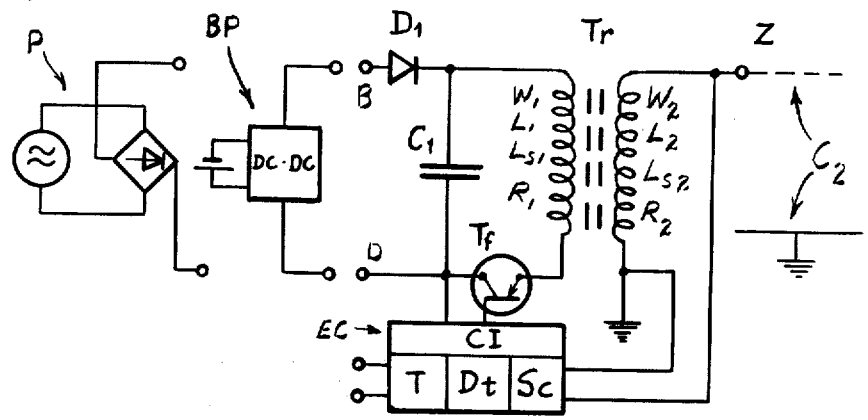
FIG. 10 is a schematic circuit diagram illustrating a second embodiment of the invention, showing an electrical fence circuit having an impulse transformer, series and parallel resonant branches, a switching transistor, and a power supply.
Figure 11:
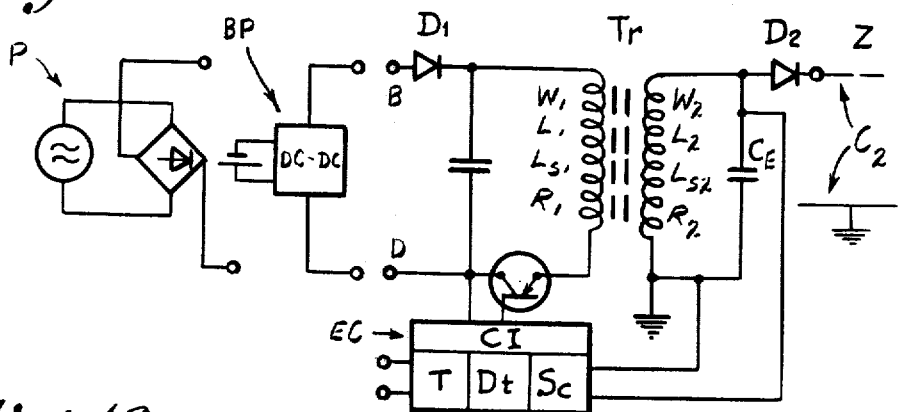
FIG. 11 is a circuit diagram similar to that of FIG. 10 but with the addition of a diode in the secondary circuit of the impulse transformer.

With regard to FIGS. 10-12, the electric scanning circuit Sc is wired to the secondary side of the pulse transformer $T_r$ to scan the voltage, and the electric differentiator Dt is connected to the scanning circuit Sc for the formation of a differential time quotient of the secondary voltage $U_2$ of the pulse transformer $T_r$. The computer and pulse generator CI is designed to furnish a pulse suited to inhibit the transistor in the presence of a positive secondary voltage above the chosen threshold $U_t$, or of a negative secondary voltage $U_2$ when the differential time quotient of the secondary voltage $dU_2/dt$ crosses zero. The pulse transformer $T_r$ with much smaller leakage inductance $L_{S1}$, $L_{S2}$ than winding inductance $L_1$, $L_2$ forms a coupled parallel and series resonant circuit due to the winding inductance and leakage inductance in conjunction with the input capacitor $C_1$ and the capacitance $C_2$ of the essentially capacitive resistance $R_3$, along with the transistor $T_f$ in the parallel resonant circuit. The parallel resonant circuit formed by the equivalent capacity of the input capacitor $C_1$ and the equivalent winding inductance $L_{E1}$ has a considerably lower electric oscillation frequency than the coupled series resonant circuit formed by the equivalent capacity $C_2$ of the essentially capacitive electric load resistance and the equivalent leakage inductance $L_{E2}$. The pulse times for FIGS. 10-12 is selected so that the pulse length in time of the firing pulses given by it to the transistor $T_f$ is shorter than the oscillation frequency half-period of the series resonant circuit, and the time interval in firing pulse sequence is substantially longer than the oscillation frequency period of the series resonant circuit.

Variations and modifications are possible without departing from the spirit of the invention.

We claim:

1. In an electric fence, in combination:
   (a) a fence conductor,
   (b) circuitry including a transforming, voltage-multiplying inductive device, said circuitry having terminals connected respectively to the fence conductor and to a ground,
   (c) said circuitry comprising a parallel resonant circuit having a primary coil containing inductance and ohmic resistance of said device, a charging capacitor and a switching thyristor all connected in series, said switching thyristor having a gate, having a predetermined turn-off-time, and being characterized by a predetermined value of holding current,
   (d) said circuitry comprising a series resonant circuit which includes said fence conductor and ground, said series resonant circuit having a secondary coil containing other inductance and ohmic resistance of said device,
   (e) means connecting said charging capacitor for continuous energization from a voltage source whereby the thyristor, in response to repetitious impulses applied to its gate, can repeatedly switch on the capacitor in the parallel resonant circuit, thereby to produce voltages and currents in the series resonant circuit,
   (f) said series resonant circuit having a predetermined resonant frequency which is so related to the holding current and the turn-off-time of the thyristor that the second half-wave of the transient current in the series resonant circuit will deprive the thyristor of its holding current and thereby switch the thyristor off.

2. The invention as defined in claim 1, wherein the thyristor automatically blocks out the first negative half-wave of the transient current.

3. The invention as defined in claim 1, wherein the inductance in the series resonant circuit is roughly one-tenth the value of the inductance in the parallel resonant circuit.

4. The invention as defined in claim 1, wherein the transient voltage between the fence and ground terminals attains a maximum value at the same time that the transient current in the parallel resonant circuit approaches zero.

5. The invention as defined in claim 1, and further including means for indicating the value at any time of the transient voltage between the terminal connected to the fence wire and the ground.

6. The invention as defined in claim 1, and further including a capacitor connected between the ground and the terminal connected to the fence wire.

7. The invention as defined in claim 6, wherein the capacitor has a capacitance equivalent to an electric fence.

8. In an electric fence, in combination:
(a) a fence conductor,
(b) circuitry including a transforming, voltage-multiplying inductive device, said circuitry having terminals connected respectively to the fence conductor and to a ground,
(c) said circuitry comprising a parallel resonant circuit having a primary coil containing inductance and ohmic resistance of said device, a charging capacitor and a switching transistor all connected in series, said transistor including a control element and being characterized by a predetermined threshold value of voltage on its control element beyond which it is switched off,
(d) said circuitry comprising a series resonant circuit which includes said fence conductor and ground, said series resonant circuit having a secondary coil containing other inductance and ohmic resistance of said device,
(e) means connecting said charging capacitor for continuous energization from a voltage source whereby the transistor, in response to repetitious impulses applied to its control element, repeatedly switches on and off the capacitor in the parallel resonant circuit, thereby to produce voltage and currents in the series resonant circuit,
(f) electronic voltage-sensitive means connected to said series resonant circuit, providing an output signal proportional to the transient voltage in said circuit,
(g) a fast time constant differentiating circuit receiving said output signal and transforming the same into a differential signal,
(h) computing and impulse generating means responsive to said differential signal, said means being coupled to the control element of the transistor for generating an impulse to switch off said transistor after the latter has been switched on by a voltage above its said threshold value, and
(i) automatically timed means for periodically providing a voltage to excite the control element of the transistor in a range to cause the transistor to be switched on.

9. The invention as defined in claim 8, wherein the voltage sensitive means is a scanning device responsive to the transient voltage in the series resonant circuit.

10. The invention as defined in claim 8, wherein the transistor is so controlled as to block out the first negative half-wave of the transient current in the parallel resonant circuit.

11. The invention as defined in claim 8, and further including
(a) a capacitor connected across the inductance of the series resonant circuit,
(b) said electronic voltage-sensitive means being connected to said capacitor.

12. The invention as defined in claim 8, wherein the inductance in the parallel resonant circuit is a large multiple of the inductance in the series resonant circuit.

13. The invention as defined in claim 8, wherein the transistor is switched off when the transient voltage in the series resonant circuit has substantially reached its maximum value.

14. The invention as defined in claim 1, wherein:
(a) the inductive device comprises a pulse transformer having primary and seconary windings,
(b) the inductance of said parallel resonant circuit including the primary winding of the transformer,
(c) a pulse timer connected to the thyristor to switch the latter on at fixed time intervals,
(d) said secondary winding of the transformer being connected to said fence conductor and ground,
(e) said pulse transformer having a smaller leakage inductance than its winding inductances,
(f) said parallel resonant circuit having an appreciably lower oscillation frequency than that of the series resonant circuit,
(g) said thyristor having a noticeable holding current which is appreciably smaller than the initial discharge current of said charging capacitor, such initial discharge current building up to a sine-shaped positive half wave in the series resonant circuit,
(h) said thyristor having a recovery time which is shorter than the oscillation frequency half-period in the series resonant circuit,
(i) said pulse timer having a pulse length in time of the firing pulse given by it to the thyristor, which is shorter than the said oscillation frequency half-period and longer than the oscillation frequency period of the series resonant circuit.

15. The invention as defined in claim 8, wherein:
(a) the inductive device comprises a pulse transformer having primary and secondary windings,
(b) the inductance of said parallel resonant circuit including the primary winding of the transformer,
(c) a pulse timer connected to the transistor to switch the latter on at fixed time intervals,
(d) an electric scanning circuit connected to the secondary winding of the pulse transformer to scan the voltage thereof,
(e) an electric differentiator connected to said scanning circuit for the formation of the differential time quotient of the secondary voltage of the pulse transformer,
(f) a computer and pulse generator connected for furnishing a pulse to inhibit the transistor in the presence of a positive secondary voltage above the chosen threshold, or of a negative secondary voltage when the differential time quotient of the secondary voltage crosses zero,
(g) said secondary winding of the transformer being connected to said fence conductor and ground,
(h) said pulse transformer having a smaller leakage inductance than its winding inductances,
(i) said parallel resonant circuit having an appreciably lower oscillation frequency than that of the series resonant circuit,
(j) said pulse timer having a pulse length in time of the firing pulse given by it to the transistor, which is shorter than the said oscillation frequency half-period and longer than the oscillation frequency period of the series resonant circuit.

16. The invention as defined in claim 1, wherein:
(a) the means connecting the charging capacitor for continuous energization is exclusive of said transforming device.

* * * * *